United States Patent [19]

Nakai

[11] Patent Number: 4,556,784
[45] Date of Patent: Dec. 3, 1985

[54] METHOD FOR CONTROLLING VERTICALLY ARRANGED HEATERS IN A CRYSTAL PULLING DEVICE

[75] Inventor: Ryusuke Nakai, Osaka, Japan

[73] Assignee: Sumitomo Electric Industries, Ltd., Osaka, Japan

[21] Appl. No.: 539,905

[22] Filed: Oct. 7, 1983

[30] Foreign Application Priority Data

Oct. 8, 1982 [JP] Japan ................. 57-177899

[51] Int. Cl.$^4$ ............................................. F27B 14/00
[52] U.S. Cl. ........................................ 219/425; 432/1
[58] Field of Search .............. 219/209, 210, 421, 422, 219/424, 425, 441, 442; 373/42, 47, 48, 49; 432/1; 252/20; 203/48; 422/245; 585/812; 23/293 R; 260/707; 156/600

[56] References Cited

U.S. PATENT DOCUMENTS 3,086,385  4/1963  Branchereau et al. ......... 219/425 X

Primary Examiner—Volodymyr Y. Mayewsky
Attorney, Agent, or Firm—Sughrue, Mion, Zinn Macpeak & Seas

[57] ABSTRACT

In the pulling of a single crystal from a melt by the Czochralski method the temperature of the melt and the crystal is controlled by a plurality of heaters surrounding the crucible in vertically disposed relation relative to each other. The lowermost heater is controlled by an automatic temperature controller in response to the temperature of the bottom of the crucible and the remaining heaters are controlled by the selectring a specific ratio for the power supply of each of the remaining heaters with respect to the power supply of the lowermost heater.

3 Claims, 7 Drawing Figures

METHOD FOR CONTROLLING VERTICALLY ARRANGED HEATERS IN A CRYSTAL PULLING DEVICE

BACKGROUND OF THE INVENTION

The present invention is directed to a method for producing a single crystal according to the Czochralski method (hereinafter referred to as the "CZ method") or the liquid capsule Czochralski method (hereinafter referred to as the "LEC method") and more particularly to a method for controlling a plurality of vertically arranged heaters during the crystal pulling operation.

According to the well known CZ method, as illustrated in FIG. 1, a melt 3 of molten crystal material is placed in a crucible 1 which is maintained at the desired temperature by heating means 22 which are located in a conventional furnace. The surface of the melt is covered with a molten solution of $B_2O_3$ (not shown) if the LEC method is being followed. A seed crystal 4 is inserted into the surface of the melt 3 and is thereafter pulled upwardly from the melt to produce a single crystal 5. During the crystal pulling operation it is necessary to maintain an absolute value of the upward temperature gradient small in the furnace according to a predetermined pattern to decrease an average dislocation density. Further, in this operation, the control of the heating means 22 within the furnace is very important to maintain the diameter of the crystal 5 constant.

As shown in FIG. 1, the heating means 22 is comprised of an upper heater 23 and a lower heater 24 disposed in vertical orientation relative to each other. Previously, in order to control the temperature gradient, a temperature control method was utilized for controlling the actual temperature of each heater or a power control method was utilized for controlling the power supplied to each heater. However, these methods suffered from the following problems:

(1) Since the temperature gradient is an intricate function heater temperature it is extremely difficult to detect variations of the temperature gradient in the crystal.

(2) Since a great deal of heat flows between the upper and lower heaters 23 and 24 by convection, the temperature of the heaters are too strongly related to each other to perform the desired control function.

(3) Since the temperature of the heaters are correlated to each other as described above, if the power for the lower heater is decreased with the temperature of the upper heater 23 maintained unchanged, then the power for the upper heater 23 is increased in order to maintain the temperature of the upper heater 23 unchanged. Therefore, the crystal is heated so that the diameter of the crystal is decreased. In other words, if the temperature of the upper or lower heater is decreased, the diameter of the crystal is decreased. On the contrary, if the temperature of the upper or lower heater is increased, the diameter of the crystal may be increased. That is, in general, if the temperature of the crystal is decreased, the diameter thereof tends to be increased. However, it is difficult to control the diameter of the crystal by using the control method as described above.

(4) In the power control method it is rather difficult to satisfactorily deal with variations in pressure or variations in the furnace wall temperature. In the heater temperature control method the variation is fed back to control the power, but in the power control method it is impossible to do so.

SUMMARY OF THE INVENTION

The present invention provides a new and improved method for controlling vertically arranged heaters in a crystal pulling operation which overcomes all of the aforementioned difficulties.

The present invention provides a new and improved method for controlling vertically arranged heaters in a crystal pulling operation wherein the heaters can be controlling with a high degree of accuracy, the diameter of the single crystal being pulled can readily be controlled and the environmental conditions during growth can readily be detected.

The present invention provides a new and improved method of controlling vertically arranged heaters in a crystal pulling operation wherein one of the heaters is controlled by an automatic temperature controller, while the remaining heaters are controlled by means of power ratios with respect to the one heater.

The method of the present invention is applicable to compounds from Groups III-V, compounds from Groups II-VI, or their mixed crystals and the single crystals of semi-conductors such as Si and Ge, oxides, nitrides, and carbides which are pulled by the CZ method or the LEC method.

The foregoing and other objects, features and advantages of the present invention will be apparent from the following more particular description of preferred embodiments of the invention as illustrated in the accompanying drawings.

DETAILED DESCRIPTION OF THE INVENTION

Figure 1:
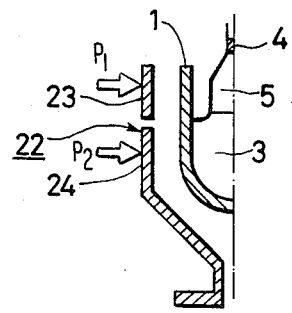
FIG. 1 is a partial schematic view, partly in section, showing a conventional crystal pulling arrangement.
Figure 2:
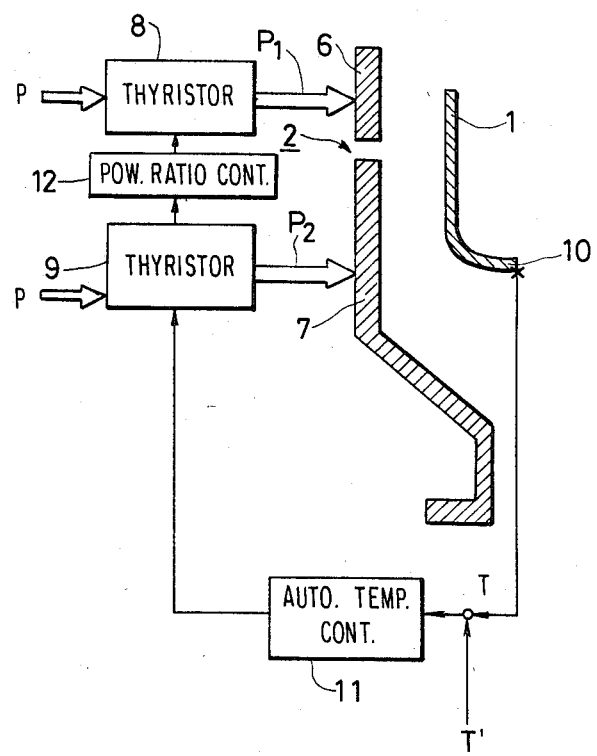
FIG. 2 is a partial schematic view, partly in section, of a crystal pulling system according to the present invention.

In FIG. 2, the heater means 2 is comprised of an upper heater 6 and a lower heater 7 which are located in a furnace (not shown). A crucible 1 is located within the furnace adjacent the upper and lower heaters 6 and 7. Electrical power is supplied through a thyristor 8 to the upper heater 6 and is supplied through a thyristor 9 to the lower heater 7. The arrows corresponding to the letters $P_1$ and $P_2$ indicate controlled power provided to the upper and lower heaters 6 and 7 respectively.

In the method according to the present invention, the power of one of the heaters, for instance the power $P_2$ for the lower heater 7, is controlled by an automatic temperature controller 11 which acts through the thyristor 9 in response to the temperature sensed at the bottom 10 of the crucible 1. In FIG. 2, reference character T' designates a set temperature value required at the bottom of the crucible.

On the other hand, the controlled power $P_1$ of the upper heater 6 is controlled by a power ratio controller 12 in such a manner that the ratio of the controlled power $P_1$ for the upper heater 6 to the controlled power $P_2$ for the lower heater 7 is equal to a set power ratio value. In this case, the temperature of the crucible bottom 10 is adjusted by the automatic temperature controller 11 and independently of the adjustment is controlled by the temperature gradient in the crucible which is effected by the power ratio control.

The variation in the diameter of the single crystal corresponds satisfactorily with the temperature of the crucible bottom 10. Therefore the single crystal diameter can be controlled merely by adjusting the temperature of the crucible bottom 10. In addition, the temperature gradient in the crucible or in the single crystal corresponds to the selected power ratio and therefore can be controlled by maintaining the power ratio unchanged.

In the example shown in FIG. 2, the two heaters are vertically disposed one above the other in the furnace but the invention is not limited in this manner. That is, the method of the present invention may be applicable when more than two heaters are vertically arranged relative to each other. In such a case, one of the heaters will be controlled by the automatic temperature controller and the power supply ratios of the remaining heaters with respect to the one heater are utilized for controlling the temperature gradient.

EXAMPLE 1

A GaAs semi-conductor single crystal having a diameter of 80 mm was produced by the LEC method according to the system shown in FIG. 2. The lower heater was controlled by the automatic temperature controller 11 according to the measured temperature of the crucible bottom 10 and the ratio of the controlled power supply $P_1$ for the upper heater 6 to the power $P_2$ for the lower heater 7 was set at 0.7. The crystal pulling operation was carried out at a pulling speed of 10 mm/hr.

Figure 3:
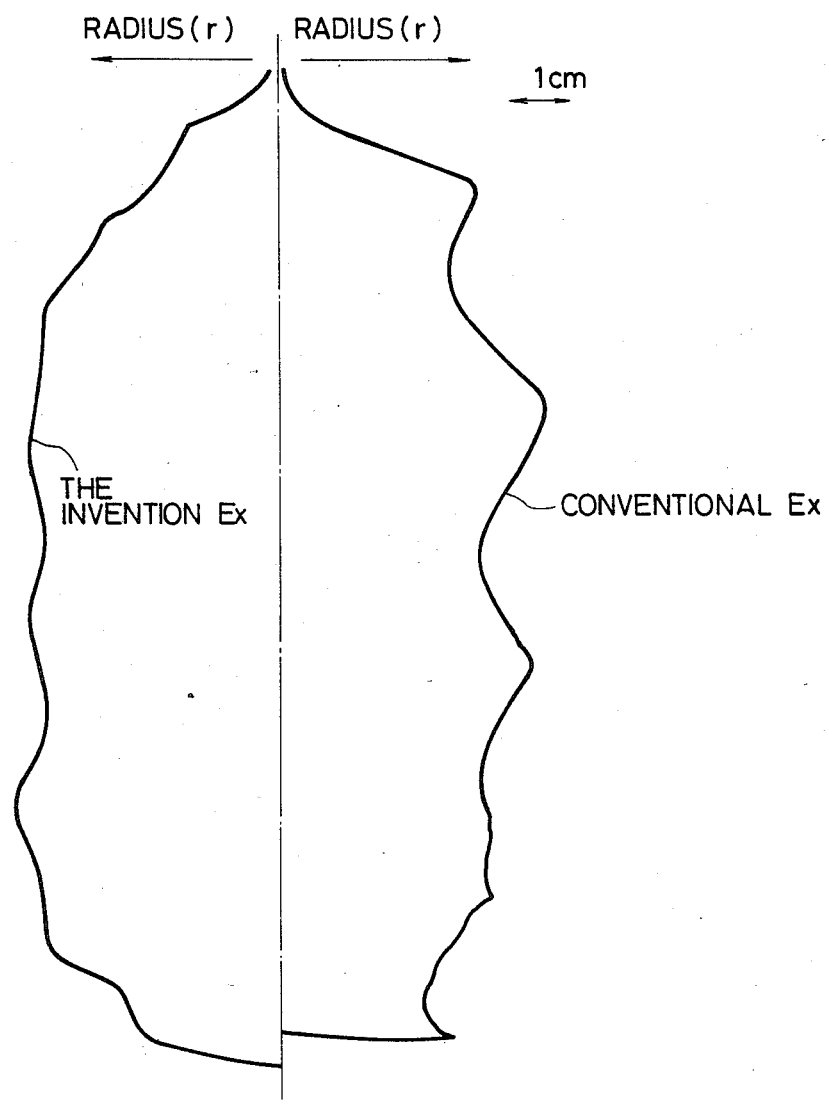
FIG. 3 is a graph showing comparative results.

By way of comparison, the pulling of a similar crystal was carried out according to the conventional method wherein both the upper and lower heaters are controlled by an automatic temperature controller. The variation in diameter of the single crystal produced according to the method of the present invention and the variation in the diameter of the single crystal produced according to th conventional method are indicated in FIG. 3 on the left and right hand sides of the center line respectively. It is apparent from FIG. 3 that the variation in diameter of the single crystal pulled in accordance with the method of the present invention is less than that in the diameter of the single crystal pulled according to the conventional method. THerefore, the diameter control is easier and more accurate using the method according to the present invention.

EXAMPLE 2

Single crystals having a diameter of 80 mm were produced by pulling the melts with a heater power supply ratio $P_1/P_2$ which varies as indicated in Table 1 below along with the average dislocation densities. The term "dislocation density" is intended to mean the etch pit density which is obtained when the section is polished and is etched with molten KOH.

TABLE 1

| Power ratio ($P_1/P_2$) | 0.4 | 0.6 | 0.8 |
|---|---|---|---|
| Average Dislocation Density | $2 \times 10^4$/cm$^2$ | $1.3 \times 10^4$/cm$^2$ | $0.8 \times 10^4$/cm$^2$ |

As is apparent from Table 1, when the power ratio is increased, the temperature gradient is decreased and the average dislocation density is also decreased.

Figure 4:
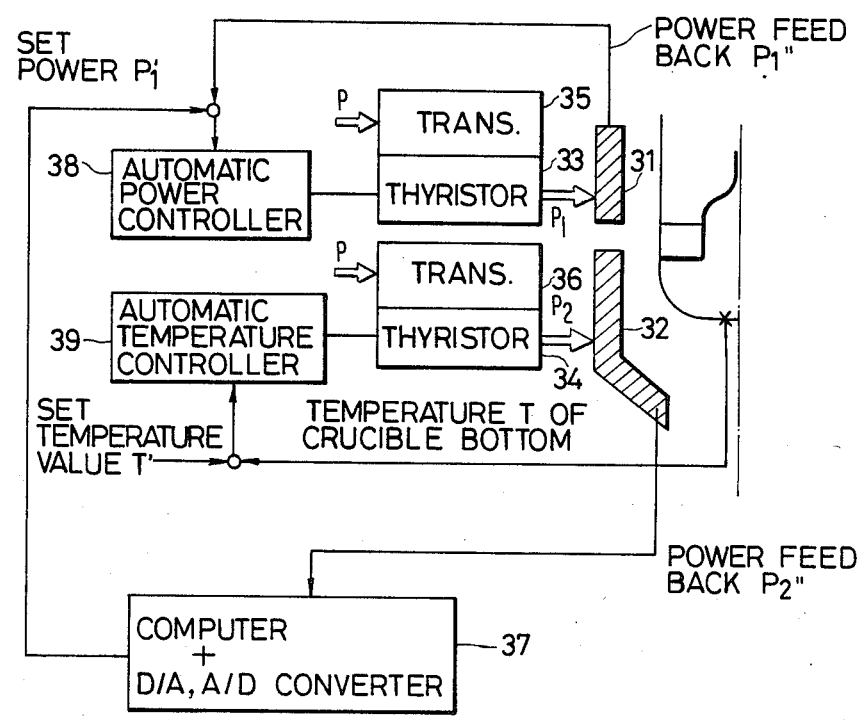
FIG. 4 is a partial schematic view, partly in section, of another crystal pulling system according to the present invention.

A further embodiment according to the present invention will be described with reference to FIG. 4.

In this embodiment, a power of a lower heater 32 is controlled by an automatic temperature controller 39 which acts through a thyristors 34 with a transformer 36 in response to the temperature T sensed at the bottom 10 of the crucible 1 and to correspond the temperature T to a set value T' required at the crucible bottom. The set value is increased or decreased in order to maintain the diameter of a single crystal constant. For instance, a lowering temperature rate of T' is slowly lowered if the diameter in pulling the single crystal is increased and the lowering temperature rate is rapidly lowered if the diameter is increased.

Controlled power $P_2$ of the lower heater 32 is inputted through an A/D converter to a computer 37 in which a set power ratio $R_p$ is multiplied to the power $P_2$ fed back from the lower heater 32 and the resultant value is outputted through a D/A converter as a set power value $P_1'$ for the upper heater 31. A power $P_1''$ of the upper heater 31 is fed back to an automatic power controller 38 so that the upper heater 31 is controlled through a thyristor 33 with a transformer 35 by the automatic power controller 38 in order to maintain the relation of $P'_1 \approx P_1''$. That is, the relation of $P_1/P_2 \approx R_p$ is maintained.

Figure 5:
FIG. 5 is a schematic view showing a pulled single crystal according to the method of FIG. 4.
Figure 6:
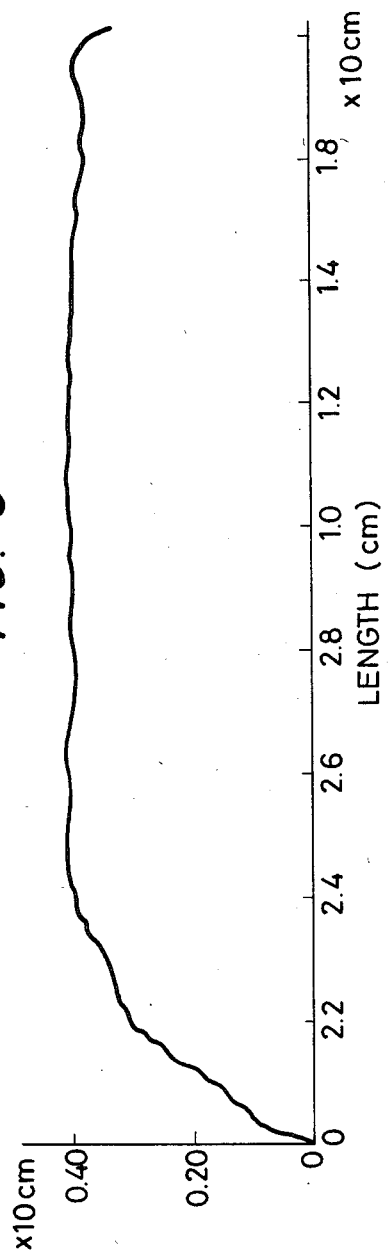
FIGS. 6 and 7 are graphs showing variations of the single crystal diameter of FIG. 4 and the comparative example, respectively.

FIGS. 5 and 6 show a schematic view of the single crystal having a diameter of about 80 mm and the variation in diameter of single crystal produced according to the method of this embodiment, respectively.

In this embodiment, the set value at the bottom temperature of the crucible is provided by a automatic diameter control of a computer.

Figure 7:
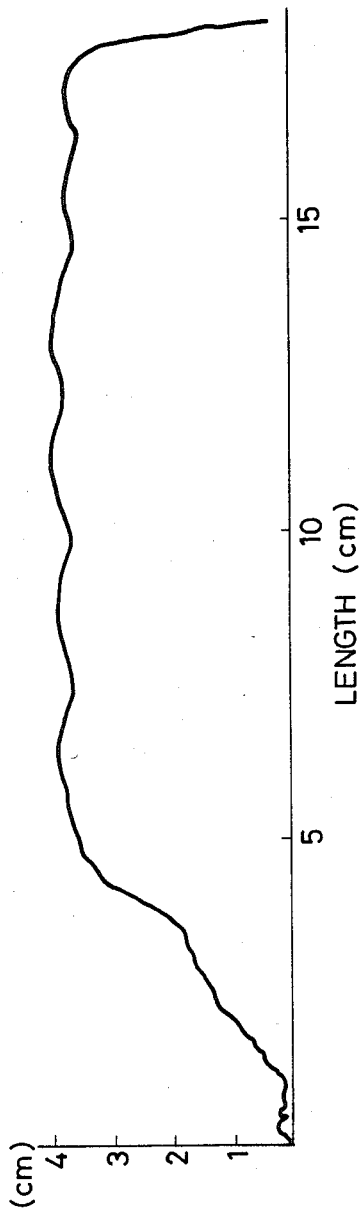

For comparison, FIG. 7 shows a variation of a single crystal according to the conventional method without using the power ratio control.

It is clear from the foregoing description that the method for controlling vertically disposed heaters in a crystal pulling device according to the present invention has the follow effects:

(a) One of a plurality of heaters is controlled by an automatic temperature control and the remaining heaters are controlled by the power supply ratios with respect to that one heater. Therefore, the temperature under the automatic temperature control and the power ratios are independent parameters in wide ranges. Accordingly, no matter how close the heaters are located with respect to one another, they can be satisfactorily controlled.

(b) The diameter of the single crystal is controlled by the automatic temperature controller only and the environmental conditions for growth are specified by the power ratios. Accordingly, the diameter of the single crystal can be readily controlled.

(c) The temperature gradient is a simple, increasing or decreasing function of the power ratio. That is, a temperature gradient is determined by specifying a particular power ratio. Therefore, the environmental conditions with respect to the growth of a single crystal can be detected, the temperature gradient can be controlled with a high degree of accuracy and the single crystal produced by the method is low in dislocation density.

While the invention has been particularly shown and described with reference to preferred embodiments thereof, it will be understood by those in the art that various changes in form and details may be made therein without departing from the spirit and scope of the invention.

What is claimed is:

1. In a method for pulling a single crystal from a melt in a crucible surrounded by a plurality of vertically disposed electrical heaters connected to respective sources of controlled electrical power comprising controlling one of said heaters by means of an automatic temperature controller and controlling the remaining heaters by maintaining a predetermined power ratio of the controlled power for the remaining heaters with respect to the controlled power for said one of said one heaters.

2. A method as set forth claim 1 further comprising operating said automatic temperature controller in response to the temperature of the bottom of said crucible.

3. A method as set forth in claim 1 wherein the lowermost heater adjacent the bottom of the crucible for controlling the single crystal diameter and wherein the temperature gradient in the crucible corresponds to said power supply ratio.

* * * * *